United States Patent [19]

Lindenmeier et al.

[11] Patent Number: 4,667,342
[45] Date of Patent: May 19, 1987

[54] TUNABLE RECEIVER INPUT CIRCUIT

[76] Inventors: Heinz Lindenmeier, Fürstenrieder Str. 7B, 8033 Planegg; Leopold M. Reiter, Karolinger Str. 22, 8031 Gilching; Gerhard Flachenecker, Bezener Str. 2, D 8012 Ottobrunn, all of Fed. Rep. of Germany

[21] Appl. No.: 589,284

[22] Filed: Mar. 14, 1984

[30] Foreign Application Priority Data

Mar. 29, 1983 [NL] Netherlands ............... 8301099

[51] Int. Cl.$^4$ ............................................. H04B 1/26
[52] U.S. Cl. ................................. 455/150; 455/291; 455/293; 455/311; 455/333; 455/341
[58] Field of Search ............... 455/150, 193, 280, 283, 455/285, 286, 291, 293, 311, 333, 340, 341; 330/294; 343/701, 712, 713

[56] References Cited

U.S. PATENT DOCUMENTS

| 3,302,118 | 1/1967 | Schoen | 455/333 |
| 3,579,113 | 5/1971 | Jabbar | 455/291 |
| 3,710,260 | 1/1973 | Wright | 455/291 |
| 4,461,042 | 7/1984 | Tanabe et al. | 455/333 |
| 4,479,259 | 10/1984 | Fenk | 455/333 |

FOREIGN PATENT DOCUMENTS

| 2166898 | 8/1976 | Fed. Rep. of Germany | 343/701 |
| 2952793 | 8/1981 | Fed. Rep. of Germany | 455/291 |

Primary Examiner—Jin F. Ng
Attorney, Agent, or Firm—Thomas A. Briody; William J. Streeter; Marianne R. Rich

[57] ABSTRACT

A tunable receiver input circuit consists of an emitter follower amplifying circuit with a resonant circuit connected between emitter and ground. The impedance of the resonant circuit is high at frequencies away from the resonant frequency. The mixer circuit is connected to the collector of the amplifying circuit, so that unwanted second and third order noise products are suppressed.

6 Claims, 2 Drawing Figures

TUNABLE RECEIVER INPUT CIRCUIT

BACKGROUND OF THE INVENTION

1. Field of the Invention

The invention relates to a tunable receiver input circuit comprising an amplifying three-pole circuit, a tunable resonant network having the characteristic of a series resonant circuit, the three-pole circuit being negatively fedback by means of the tunable resonant network, and a mixing circuit coupled to the three-pole circuit.

2. Description of The Prior Art

Such a tunable receiver input circuit is disclosed in German Patent Application No. 29 52 793, which has been laid open to public inspection and is inter alia used in car radios having a passive or a so-called active antenna.

The tunable receiver input circuit with mixing stage has for its object to select an antenna signal and to convert this signal into an intermediate-frequency signal of the receiver by means of an oscillator. Such a conversion must be as low in noise as possible and must be effected as free from interferences caused by non-linear effects as possible.

The said German Application No. 29 52 793, which has been laid open to public inspection discloses a tunable receiver input circuit having a receiving section connected across a portion of the resonant network, this receiver section comprising a mixing circuit. Such a circuit has the disadvantage that the mixing circuit is driven without further linearisation measures being taken. This results in second and third order noise products being generated due to non-linearity of the mixing circuit itself, in spite of the fact that the received signals applied to the mixing circuit are preselected by the resonant network and consequently the mixing circuit is adequately protected from interferences at the mirror signal frequency.

In receiving areas in which the available frequency bands are very crowded this results, more specifically in the case of very powerful transmitters, in a highly disturbed reception by combined second and third order frequencies.

SUMMARY OF THE INVENTION

The invention has for its object to prevent the formation of non-linear noise products in the mixing circuits to a very large extent in a very simple way for a tunable receiver input circuit of the type described in the preamble.

According to the invention, the tunable receiver input circuit of the type described in the opening paragraph is characterized in that the mixing circuit is included in a series arrangement with the three-pole circuit to linearise the mixing circuit by means of the current flowing through the three-pole circuit.

This has the advantage that the frequency dependence of the resonant network in the feedback path of the three-pole circuit does not only operate selectively for the mixing circuit but also for the linearisation of the mixing circuit.

A further advantage is that the mixing circuit is not connected to a branch of the resonant network, so that the resonant network may be a pure bipolar network with the character of a series resonant circuit, which results in a very simple resonant network because of the fact that an additional coupling network for coupling the resonant network to the mixing circuit is not required.

According to a further measure in accordance with the invention a tunable input circuit, the resonant network being included in the emitter circuit of the three-pole circut, is characterized in that the mixing circuit is included in the collector circuit of the three-pole circuit.

This embodiment ensures in the simplest possible way that the linearisation operation of the resonant network by negative feedback is not only used for the three-pole circuit but also for the mixing circuit.

BRIEF DESCRIPTION OF THE DRAWING

The invention and its advantage will now be described in greater detail by way of example with reference to the embodiments shown in the accompanying Figures, corresponding elements in the different Figures having been given the same reference numerals. Therein.

DESCRIPTION OF THE PREFERRED EMBODIMENTS

Figure 1:
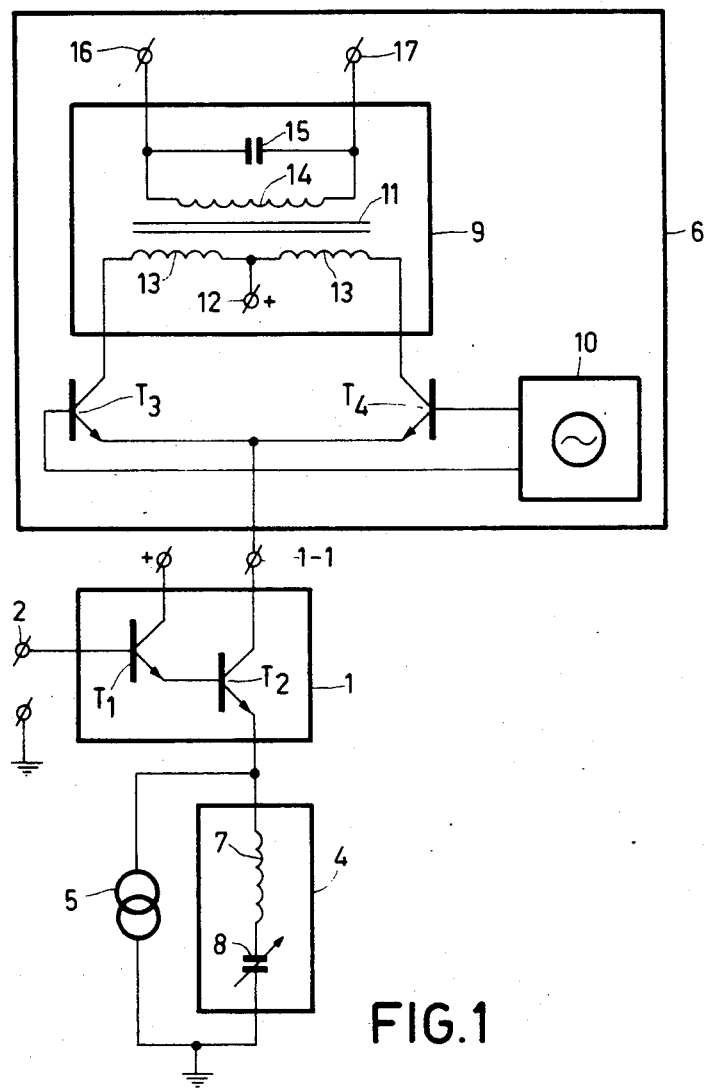
FIG. 1 shows an embodiment of a tunable receiver input circuit according to the invention and FIG. 2 shows a further embodiment of a tunable receiver input circuit according to the invention.

FIG. 1 shows a tunable receiver input circuit with mixing stage for use in receivers which may optionally be connected to a passive or to an active antenna. It relates in particular to receivers for motor cars, which receivers operate in the long wave, the medium wave and the short wave ranges.

The receiver input circuit comprises an amplifying three-pole circuit 1 to which an antenna signal is applied at a control input 2. A tunable resonant network 4 and a direct current source 5 are included in the emitter circuit of the three-pole circuit 1 while a mixing circuit 6 is connected in the collector circuit.

The amplifying three-pole circuit 1 comprises a first transistor $T_1$, which is connected as an emitter follower and may be in the form of a field effect transistor or a bipolar transistor, and an output transistor $T_2$ connected thereto and serving as a high-ohmic current source for the mixing circuit 6. It is however alternatively possible to use only one transistor as the amplifying three-pole circuit or a combination of three transistors consisting of a field-effect input transistor in emitter follower arrangement and, connected thereto, a combination of two bipolar transistors which are arranged in parallel for high frequencies. The latter configuration has the characteristic of a field-effect transistor with increased forward transconductance.

The tunable resonant circuit 4 provided in the emitter circuit of the amplifying three-pole circuit has the characteristic of a series resonant circuit. FIG. 1 shows the simplest embodiment thereof, provided by the series arrangement of a fixed coil 7 and a variable capacitor 8.

The direct current required for setting the transistors $T_1$ and $T_2$ is supplied by a current source 5, which is arranged in parallel with the resonant network. Instead of a current source a resistor may alternatively be used. A current source has the advantage that it has a higher a.c. impedance than d.c. resistance, with a finite value determined by the voltage of the voltage source and the value of the supply current required.

The input impedance of the receiver input circuit is formed by the series arrangement of the impedances of the base-emitter junctions of the transistors $T_1$ and $T_2$ with the impedance of the resonant network, so that the active three-pole circuit has feedback instituted by this impedance. The resonant network is dimensioned such that it resonates at the desired operating frequency, which resonance can be shifted optionally by means of the variable capacitor 8 over the overall frequency band required.

As a series resonant circuit has its lowest impedance at resonance, which is moreover very low and substantially real, the gain of the negatively fedback three-pole circuit is at its highest at the operating frequency. The impedance of a series circuit rapidly increases with increasing distance of the frequency relative to the resonant frequency. Consequently, the gain of the negatively feedback three-pole circuit rapidly decreases with increasing distance of a required frequency relative to the adjusted resonant frequency.

This results in the formation of noise products due to intermodulation and cross-modulation in the active three-pole circuit being reduced, that is to say that because of the negative feedback for unwanted signals located outside the resonant frequency, linearization is effected to the extent of the negative feedback impedance.

The mixing circuit included in the collector circuit of the amplifying three-pole circuit 1 comprises two transistors $T_3$ and $T_4$, whose emitters are interconnected and connected to the collector output 1—1 of the three-pole circuit. The collectors of these transistors are connected to an output circuit 9 and their bases to an oscillator 10. The oscillator drives the transistors $T_3$ and $T_4$ in anti-phase, that is to say differentially by an oscillator signal generated by the oscillator.

The mixing signals of the input signal amplified by the three-pole circuit 1, which signals are obtained in known manner, and the oscillator signal in the transistors $T_3$ and $T_4$, generated by the oscillator 10, are added together in the output circuit 9. This output circuit comprises a transformer 11 having a first winding 13 with a center tap 12 connected between the collectors of the transistors $T_3$ and $T_4$, and a secondary winding 14. The center tap 12 is a supply terminal to which a first supply voltage is applied. A direct current required by the setting of the transistors $T_3$ and $T_4$ then flows from the terminal 12, the two halves of the primary winding, the main current paths of the transistors $T_3$ and $T_4$ and via transistor $T_2$ and the current source to a point of common potential.

A capacitor 15 whose capacitance together with the inductance of the secondary winding 14 provides an intermediate frequency filter is connected across the secondary winding 14. The intermediate-frequency signal can be taken off from between the terminals 16 and 17.

However, the output circuit 9 may alternatively be realized by means of summing amplifiers and a separate intermediate-frequency filter.

What makes this tunable receiver input circuit so special is the fact that the transistor $T_2$ is used as a highly linear current source for the mixing circuit 6.

The total current from the transistors $T_3$ and $T_4$ of the mixing circuit is therefore not only selected by the resonant network 4, but, because of the negative feedback of the transistor $T_2$ of the mixing circuit which transistor operates as the a.c. source, it is substantially free from second and third order noise products. This results from the fact that with the object of suppressing second order noise products the negative feedback impedance manifests itself in a square-law manner and that with the object of suppressing third-order noise products the negative feedback impedance manifests itself as a power of three, which can be demonstrated in a simple manner. Consequently, the resonant network 4 is very effective as regards preventing second and third order non-linear effects.

Figure 2:
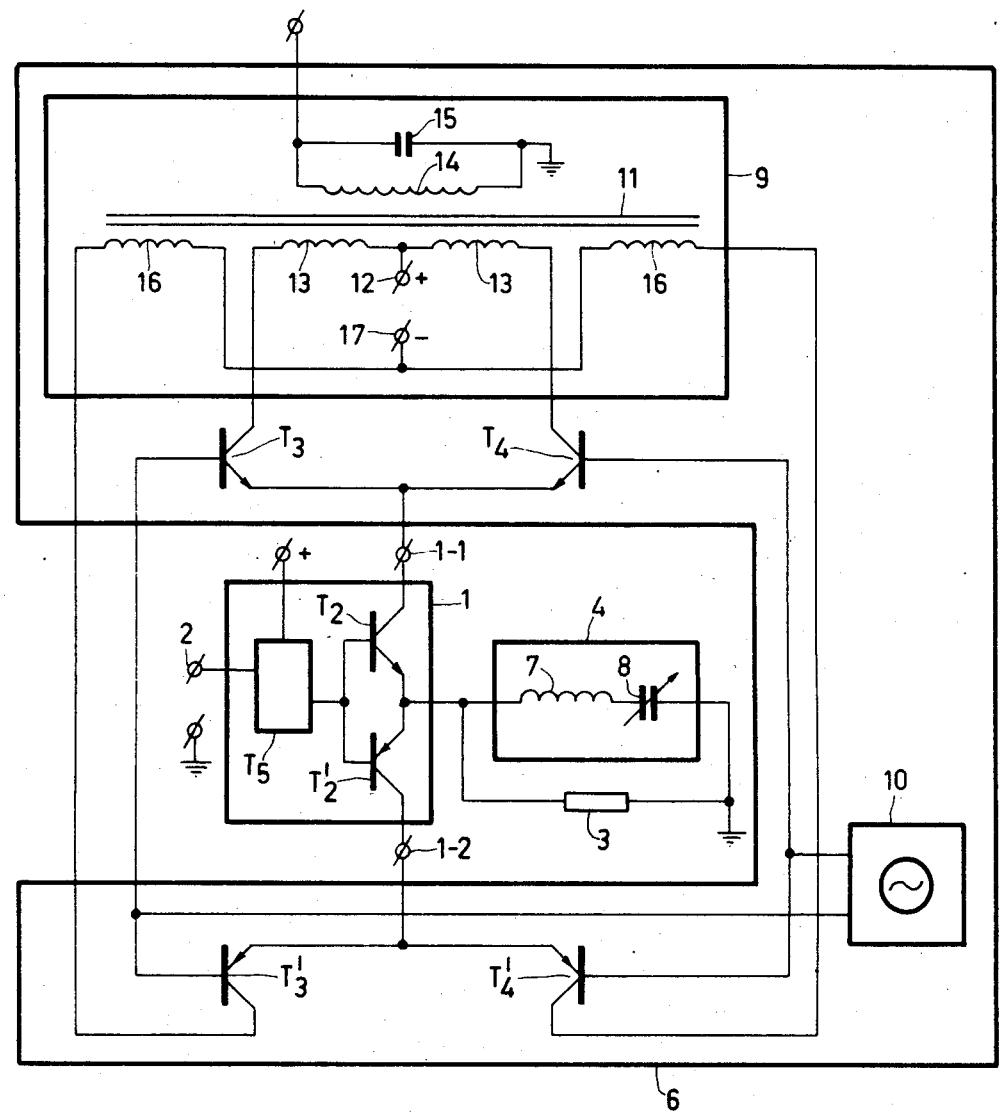

A tunable receiver input circuit having the highest possible degree of sensitivity, can be realized with the embodiment shown in FIG. 2.

This Figure shows a balanced embodiment of the receiver input circuit shown in FIG. 1. In addition to the components shown in FIG. 1, the amplifying three-pole circuit comprises a transistor $T_5$ which conducts equally in two directions, for example a FET, and a complementary output transistor $T'_2$, whose collector is connected to a second collector output 1-2 of the three-pole circuit is added to the output transistor $T_2$. A transistor circuit $T'_3$ and $T'_4$ which is complementary to the transistor circuit $T_3$ and $T_4$ and is provided in the mixing circuit is connected to this second collector output 1-2. The bases of the transistors $T'_3$ and $T'_4$ are connected to the respective bases of the transistors $T_3$ and $T_4$, the emitters are connected to the second collector output 1-2 of the three-pole circuit 1 and the collectors are connected to a second primary winding 16 of transformer 14 in output circuit 9. The center tap 17 of the second primary winding is a supply voltage terminal to which a negative supply voltage is applied.

In this embodiment, instead of a current source a resistor 3 is connected across the series resonant circuit 4 to have the control currents flow via the common potential.

The complementary transistor circuit $T'_2$, $T'_3$ and $T'_4$ and the second primary transformer winding 16 operate in exactly the same way as the transistor circuit $T_2$, $T_3$ and $T_4$ and the first primary winding 13, but for the reverse current direction.

This balanced embodiment has the advantage that no setting currents are required and a larger drive range is obtained and has also the advantage that a further suppression of unwanted cross-modulation products is realised.

From this Figure it will further be obvious that it is possible to connect the collector outputs of the transistors $T_2$ and $T'_2$ to the bases of the pairs of transistors $T_3$, $T_4$ and $T'_3$, $T'_4$ instead of the outputs of the oscillator 10, and to connect the oscillator 10 to the emitters of the pairs of transistors $T_3$, $T_4$ and $T'_3$, $T'_4$.

This may also be effected in the circuit shown in FIG. 1 by giving the three-pole circuit a construction as shown in FIG. 2 and to connect an output of the oscillator to a common potential.

What is claimed is:

1. A tunable receiver input circuit comprising:
   a mixer circuit connected to receive an oscillator signal and an input signal;
   a three terminal transistor amplifying circuit having a first input terminal, a second terminal and a third terminal, a tunable series resonant network comprising an inductor and capacitor providing negative feedback for said amplifier, said second and third terminals connected in series between said mixer circuit and said resonant network to supply said input signal for mixing with said local oscillator signal, whereby the gain of said amplifying circuit varies as a function of frequency, and said signal for mixing comprises a current flowing through both said inductor and capacitor which linearizes said mixer circuit by suppressing second order and third order non-linear effects of said mixer circuit.

2. A tunable receiver input circuit as claimed in claim 1, wherein said amplifying circuit has a control input connected to said first input terminal, a collector output connected to said third terminal, and an emitter output; and wherein said resonant circuit is connected to said emitter output and said second terminal and said mixing circuit is connected to said collector output.

3. A tunable receiver input circuit as claimed in claim 2, wherein said mixing circuit comprises a first pair of mixer transistors each having a mixer emitter connected to said collector output of said amplifying circuit, each of said mixer transistors further having a base and a collector, said mixing circuit further comprising oscillator means connected to said bases of said mixer transistors for differentially driving said pair of mixer transistors, and an output circuit connected to said collectors of said pair of mixer transistors.

4. A tunable receiver input circuit as claimed in claim 3, wherein said amplifying circuit comprises two complementary output transistors having bases coupled to said control input, interconnected connector emitters connected to said emitter output and a first and second collector, said first collector providing said collector output; and wherein said pair of mixer transistors constitutes a first pair of mixer transistors and said mixing circuit further comprises a second pair of mixer transistors complementary to said first pair of mixer transistors, said second pair of mixer transistors having interconnected emitters connected to said second collector of said amplifying circuit, a second pair of bases connected to said oscillator means and a pair of second mixer collectors; and wherein said mixer circuit further comprises an output circuit connected to said pair of second mixer collectors.

5. A receiver circuit as claimed in claim 4, wherein said output circuit comprises a transformer having a first primary winding having a center tap, means connecting said first primary winding between said collectors of said first pair of mixer transistors, a secondary winding, a capacitor connected to said secondary winding for constituting an intermediate frequency filter together with said secondary winding, and means for applying a first supply voltage to said center tap of said first primary winding.

6. A receiver input circuit as claimed in claim 5, wherein said transformer has a second primary winding connected between said collectors of said second pair of mixer transistors, said second primary winding having a center tap, and means for applying a second supply voltage different from said first supply voltage to said center tap of said second primary winding.

* * * * *